United States Patent
Zhang et al.

(10) Patent No.: US 8,732,537 B2
(45) Date of Patent: May 20, 2014

(54) METHOD AND SYSTEM FOR SYMBOL ERROR RATE ESTIMATION AND SECTOR QUALITY MEASUREMENT

(75) Inventors: Fan Zhang, Milipitas, CA (US); Wu Chang, Sunnyvale, CA (US); Ming Jin, Fremont, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 107 days.

(21) Appl. No.: 13/567,740

(22) Filed: Aug. 6, 2012

(65) Prior Publication Data

US 2014/0040682 A1   Feb. 6, 2014

(51) Int. Cl.
*G06F 11/00* (2006.01)
(52) U.S. Cl.
USPC ........... 714/704; 714/764; 714/780; 714/794; 714/763; 714/774
(58) Field of Classification Search
None
See application file for complete search history.

(56) References Cited

U.S. PATENT DOCUMENTS

| | | | |
|---|---|---|---|
| 8,156,403 B2* | 4/2012 | Shalvi et al. | 714/764 |
| 8,473,806 B1* | 6/2013 | Rad et al. | 714/752 |
| 2006/0015802 A1* | 1/2006 | Hocevar | 714/805 |
| 2008/0151617 A1* | 6/2008 | Alrod et al. | 365/185.2 |
| 2011/0239089 A1* | 9/2011 | Haratsch et al. | 714/763 |
| 2012/0054576 A1* | 3/2012 | Gross et al. | 714/752 |

FOREIGN PATENT DOCUMENTS

WO   WO2010039866   4/2010

* cited by examiner

*Primary Examiner* — John Trimmings
(74) *Attorney, Agent, or Firm* — Suiter Swantz pc llo

(57) ABSTRACT

A probabilistic approach of symbol error estimation is disclosed. The probabilistic approach of symbol error estimation reflects the number of symbol errors more precisely than the number of unsatisfied checks. The more precise quality metric calculated in accordance with the present disclosure allows a codec system to achieve a better overall performance. In addition, many other features that previously depend on the number of unsatisfied checks as the sector quality metric may also benefit by adopting the more precise quality metric.

11 Claims, 1 Drawing Sheet

200

202 — For each particular check node of the plurality of check nodes, calculating a probability of said particular check node being an unsatisfied check node 204 — Selecting k+1 number of check nodes from the plurality of check nodes, each of the selected check nodes having a greater probability of being an unsatisfied check node than the non-selected check nodes 206 — Calculating a probability of having k-number of unsatisfied check nodes based on the probabilities of the selected k+1 number of check nodes being unsatisfied check nodes

METHOD AND SYSTEM FOR SYMBOL ERROR RATE ESTIMATION AND SECTOR QUALITY MEASUREMENT

TECHNICAL FIELD

The present invention relates to the field of data processing and particularly to a method and system for symbol error rate estimation and sector quality measurement.

BACKGROUND

The number of unsatisfied checks (USCs) refers to the number of parity-check equations that are not satisfied during a decoding process. Currently, the number of USCs in each decoder iteration is commonly used as an estimation of the number of error symbols, which may be used to calculate the symbol error rate. Knowing the symbol error rate of each sector in the queuing system can help allocating resource more efficiently, improving sector failure rate (SFR) performance, and also reducing power consumptions.

However, the number of USCs does not reflect the number of symbol errors in some cases. Therein lies the need to provide a method and system for symbol error rate estimation and sector quality measurement without the aforementioned shortcomings.

SUMMARY

Accordingly, an embodiment of the present disclosure is directed to a method for symbol error rate estimation for a decoder. The decoder may include a plurality of check nodes and a plurality of variable nodes. The method in accordance with the present disclosure may include: calculating a probability of each particular check node of the plurality of check nodes being an unsatisfied check node; selecting k+1 number of check nodes from the plurality of check nodes, each of the selected check nodes having a greater probability of being an unsatisfied check node than the non-selected check nodes; and calculating a probability of having k-number of unsatisfied check nodes based on the probabilities of the selected k+1 number of check nodes being unsatisfied check nodes.

A further embodiment of the present disclosure is directed to a method for symbol error rate estimation for a decoder. The decoder may include a plurality of check nodes and a plurality of variable nodes. The method in accordance with the present disclosure may include: calculating a probability of each particular check node of the plurality of check nodes being an unsatisfied check node. The steps for calculating the probability of each particular check node being an unsatisfied check node may include: analyzing at least one previously performed decoding process and identifying a most ambiguous variable node connected to said particular check node; calculating a log-likelihood ratio (LLR) of the most ambiguous variable node; and calculating the probability of said particular check node being an unsatisfied check node based on the LLR of the most ambiguous variable node. The method in accordance with the present disclosure may further include: selecting k+1 number of check nodes from the plurality of check nodes, each of the selected check nodes having a greater probability of being an unsatisfied check node than the non-selected check nodes; and calculating a probability of having k-number of unsatisfied check nodes based on the probabilities of the selected k+1 number of check nodes being unsatisfied check nodes.

An additional embodiment of the present disclosure is directed to a computer-readable device having computer-executable instructions for performing a symbol error rate estimation method for a decoder. The decoder may include a plurality of check nodes and a plurality of variable nodes. The symbol error rate estimation method may include: calculating a probability of each particular check node of the plurality of check nodes being an unsatisfied check node; selecting k+1 number of check nodes from the plurality of check nodes, each of the selected check nodes having a greater probability of being an unsatisfied check node than the non-selected check nodes; and calculating a probability of having k-number of unsatisfied check nodes based on the probabilities of the selected k+1 number of check nodes being unsatisfied check nodes.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Studies of the correlation between the number of USCs and the number of symbol errors show that the number of USCs does not reflect the number of symbol errors in some cases. More specifically, the number of USCs has poor correlations to the number of symbol errors when trapping set errors dominant. This implies that the number of USCs is a poor quality metric for the low error rate regime.

The present disclosure is directed to a probabilistic approach of symbol error estimation which reflects the number of symbol errors more precisely than the number of USCs. The more precise quality metric calculated in accordance with the present disclosure allows a codec system to achieve a better overall performance. In addition, many other features that previously depend on the number of USCs as the sector quality metric may also benefit by adopting the more precise quality metric.

Figure 1:
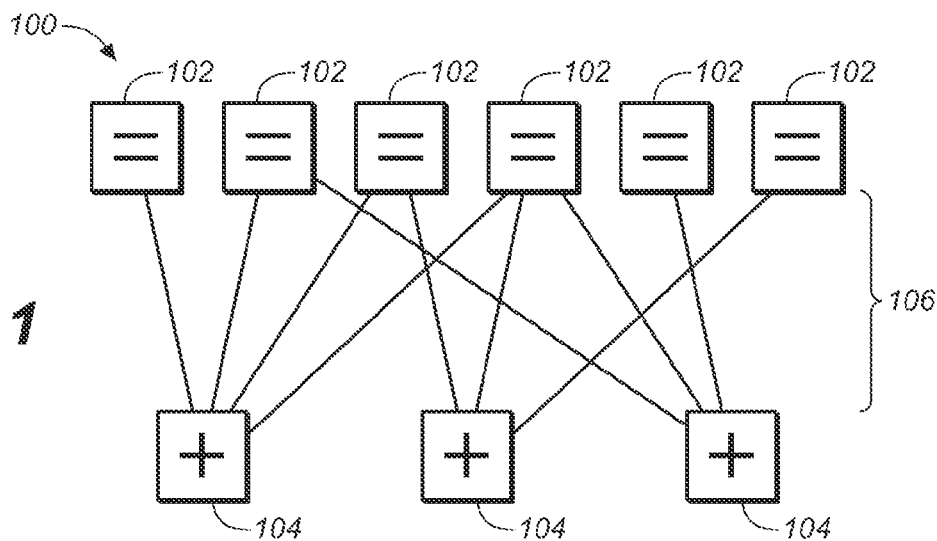
FIG. 1 is a graph notation depicting a parity-check decoder.

Referring to FIG. 1, a graph notation depicting a parity-check decoder 100 is shown. The parity-check decoder 100 may include a plurality of variable nodes 102 connected to a plurality of check nodes 104 via a number of edges 106. It is understood that the decoder 100 depicted in FIG. 1 is merely exemplary. The method for estimating symbol error rates in accordance with the present disclosure may be utilized for decoders having different number of variable nodes, check nodes and edges.

Figure 2:
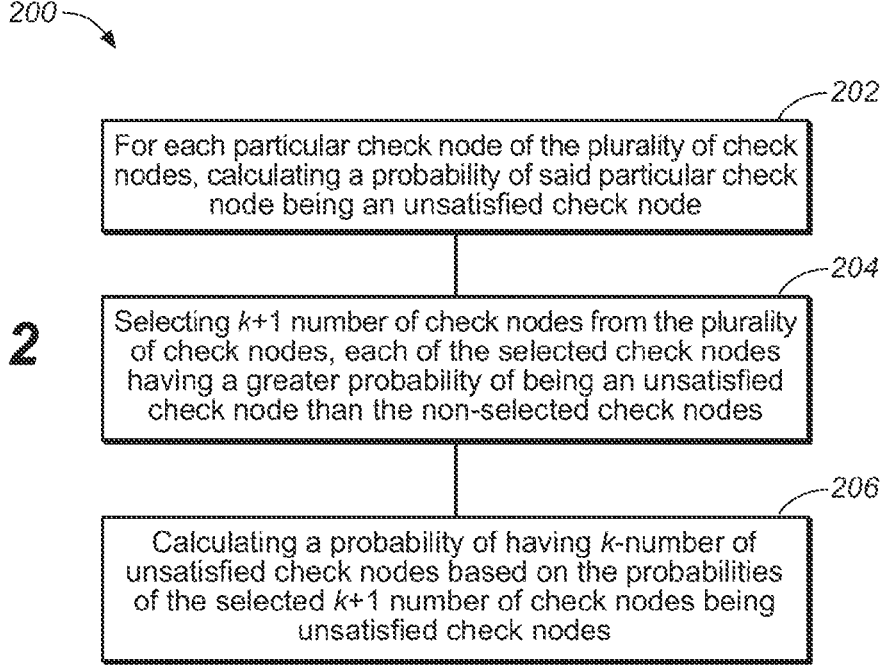
FIG. 2 is a flow diagram illustrating a method for estimating the symbol error rate of a decoder in accordance with the present disclosure.

Referring to FIG. 2, a flow diagram illustrating a method 200 for estimating the symbol error rate of a decoder is shown. Step 202 may first calculate a probability, denoted as $\text{Prob}_{USC}(i)$, for each check node i in the decoder. $\text{Prob}_{USC}(i)$ represents the probability of check node i being an unsatisfied check node. In one embodiment, calculating $\text{Prob}_{USC}(i)$ may include an analyzing step where one or more previously performed decoding process is analyzed to identify the most ambiguous variable node (e.g., where missing values occur the most) connected to the particular check node i. Once the most ambiguous variable node is identified, a log-likelihood ratio (LLR) of this variable node may then be calculated.

For the purpose of simplicity, assuming binary coding is implemented (i.e., the variable node may either be 1 or 0), LLR of this variable node may be calculated as $$\log\left(\frac{p_0}{p_1}\right),$$

where $p_0$ represents the probability of this variable node being a 0, and $p_1$ represents the probability of this variable node being a 1. It is contemplated, however, that the calculation of LLR may be configured to cover non-binary coding implementations without departing from the spirit and scope of the present disclosure. Regardless of the specific implementation, the value of LLR may be bounded between $l_{max}$ and $l_{min}$, which are the maximum and minimum values supported by the decoder. $l_{max}$ and $l_{min}$ are design features of the decoder circuit, and therefore may be considered to be predetermined values.

Once the LLR of the most ambiguous variable node connected to check node i is determined, $\text{Prob}_{USC}(i)$ may be calculated based on the LLR of the most ambiguous variable node. More specifically, $\text{Prob}_{USC}(i)$ may be calculated according to equation:

$$\text{Prob}_{USC}(i) = \begin{cases} 1 - \dfrac{LLR - l_{max}}{l_{max} - l_{min}}, & LLR > 0 \\ 1 - \dfrac{LLR + l_{max}}{l_{max} - l_{min}}, & LLR \le 0 \end{cases}$$

It is contemplated that step 202 may calculate $\text{Prob}_{USC}$ for every check node in the decoder. Knowing the probability of each check node to be an unsatisfied check node allows a precise calculation of the probability of having k-number of unsatisfied check nodes, where k is a number between 1 and the total number of check nodes. However, since the precise calculation may be relatively time-consuming, a simplified approach that calculates the first-order approximation to the precise calculation may be utilized.

For instance, step 204 may select k+1 number of check nodes among all check nodes, wherein the selected check nodes have the k+1 largest $\text{Prob}_{USC}$ values. That is, $\text{Prob}_{USC}$ of each of the selected check nodes is greater than $\text{Prob}_{USC}$ of any of the non-selected check nodes. This may be implemented by sorting the check nodes based on $\text{Prob}_{USC}$ values and select the k+1 largest ones. Once the k+1 number of check nodes are selected (may be collectively referred to as set U), step 206 may calculate the probability, denoted as Prob(k), of having k-number of unsatisfied check nodes. In one embodiment, Prob(k) may be calculated according to equation:

$$\text{Prob}(k) = \sum_{i=1}^{k+1} \left((k+1) \times (1 - \text{Prob}_{USC}(i)) \times \prod_{j \ne i} \text{Prob}_{USC}(j)\right)$$

Where $i, j \in U$.

Testing results indicate that the correlation between Prob(k) calculated in accordance with the present disclosure and the number of symbol errors is better than the correlation between the number of USCs and the number of symbol errors. The more precise quality metric calculated in accordance with the present disclosure allows a codec system to achieve a better overall performance. In addition, many other features that previously depend on the number of USCs as the sector quality metric may also benefit by adopting the more precise quality metric.

Figure 3:
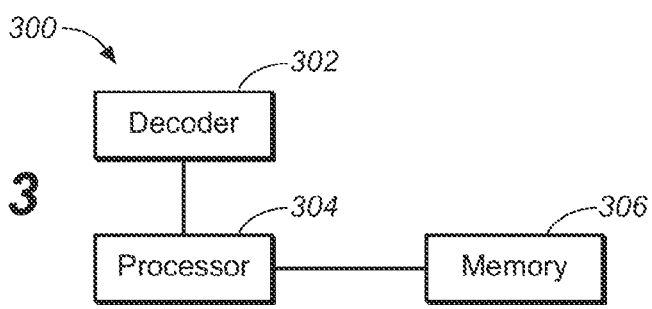
FIG. 3 is a block diagram illustrating a system for estimating the symbol error rate of a decoder in accordance with the present disclosure.

Referring to FIG. 3, a block diagram illustrating a system 300 for estimating the symbol error rate of a decoder 302 is shown. The decoder 302 may be communicatively coupled with a processor 304. The processor 304 may calculate the probability of each check node to be an unsatisfied check node. The calculated probability for each check node may be stored in a memory 306. The processor 304 may then select k+1 number of check nodes based on their associated probabilities. The selected k+1 number of check nodes may be utilized to calculate the probability of having k-number of unsatisfied check nodes as described above.

It is to be understood that the present disclosure may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for symbol error rate estimation for a decoder, the decoder having a plurality of check nodes and a plurality of variable nodes, the method comprising:

for each particular check node of the plurality of check nodes, calculating a probability of said particular check node being an unsatisfied check node;

selecting k+1 number of check nodes from the plurality of check nodes, each of the selected check nodes having a greater probability of being an unsatisfied check node than the non-selected check nodes; and calculating a probability of having k-number of unsatisfied check nodes based on the probabilities of the selected k+1 number of check nodes being unsatisfied check nodes.

2. The method of claim 1, wherein calculating a probability of said particular check node being an unsatisfied check node further comprises:

analyzing at least one previously performed decoding process and identifying a most ambiguous variable node connected to said particular check node;

calculating a log-likelihood ratio (LLR) of the most ambiguous variable node; and calculating the probability of said particular check node being an unsatisfied check node based on the LLR of the most ambiguous variable node.

3. The method of claim 2, wherein the probability of said particular check node (i) being an unsatisfied check node is calculated according to equation:

$$Prob_{USC}(i) = \begin{cases} 1 - \dfrac{LLR - l_{max}}{l_{max} - l_{min}}, & LLR > 0 \\ 1 - \dfrac{LLR + l_{max}}{l_{max} - l_{min}}, & LLR \leq 0 \end{cases}$$

wherein $l_{max}$ and $l_{min}$ are maximum and minimum values supported by the decoder.

4. The method of claim 3, wherein the probability of having k-number of unsatisfied check nodes is calculated according to equation:

$$Prob(k) = \sum_{i=1}^{k+1}\left((k+1) \times (1 - Prob_{USC}(i)) \times \prod_{j \neq i} Prob_{USC}(j)\right).$$

5. A method for symbol error rate estimation for a decoder, the decoder having a plurality of check nodes and a plurality of variable nodes, the method comprising:

for each particular check node of the plurality of check nodes, calculating a probability of said particular check node being an unsatisfied check node, further including
analyzing at least one previously performed decoding process and identifying a most ambiguous variable node connected to said particular check node;
calculating a log-likelihood ratio (LLR) of the most ambiguous variable node; and
calculating the probability of said particular check node being an unsatisfied check node based on the LLR of the most ambiguous variable node;

selecting k+1 number of check nodes from the plurality of check nodes, each of the selected check nodes having a greater probability of being an unsatisfied check node than the non-selected check nodes; and calculating a probability of having k-number of unsatisfied check nodes based on the probabilities of the selected k+1 number of check nodes being unsatisfied check nodes.

6. The method of claim 5, wherein the probability of said particular check node (i) being an unsatisfied check node is calculated according to equation:

$$Prob_{USC}(i) = \begin{cases} 1 - \dfrac{LLR - l_{max}}{l_{max} - l_{min}}, & LLR > 0 \\ 1 - \dfrac{LLR + l_{max}}{l_{max} - l_{min}}, & LLR \leq 0 \end{cases}$$

wherein $l_{max}$ and $l_{min}$ are maximum and minimum values supported by the decoder.

7. The method of claim 6, wherein the probability of having k-number of unsatisfied check nodes is calculated according to equation:

$$Prob(k) = \sum_{i=1}^{k+1}\left((k+1) \times (1 - Prob_{USC}(i)) \times \prod_{j \neq i} Prob_{USC}(j)\right).$$

8. A computer-readable device having computer-executable instructions for performing a symbol error rate estimation method for a decoder, the decoder having a plurality of check nodes and a plurality of variable nodes, the method comprising:

for each particular check node of the plurality of check nodes, calculating a probability of said particular check node being an unsatisfied check node;

selecting k+1 number of check nodes from the plurality of check nodes, each of the selected check nodes having a greater probability of being an unsatisfied check node than the non-selected check nodes; and calculating a probability of having k-number of unsatisfied check nodes based on the probabilities of the selected k+1 number of check nodes being unsatisfied check nodes.

9. The computer-readable device of claim 8, wherein calculating a probability of said particular check node being an unsatisfied check node further comprises:

analyzing at least one previously performed decoding process and identifying a most ambiguous variable node connected to said particular check node;

calculating a log-likelihood ratio (LLR) of the most ambiguous variable node; and calculating the probability of said particular check node being an unsatisfied check node based on the LLR of the most ambiguous variable node.

10. The computer-readable device of claim 9, wherein the probability of said particular check node (i) being an unsatisfied check node is calculated according to equation:

$$Prob_{USC}(i) = \begin{cases} 1 - \dfrac{LLR - l_{max}}{l_{max} - l_{min}}, & LLR > 0 \\ 1 - \dfrac{LLR + l_{max}}{l_{max} - l_{min}}, & LLR \leq 0 \end{cases}$$

wherein $l_{max}$ and $l_{min}$ are maximum and minimum values supported by the decoder.

11. The computer-readable device of claim 10, wherein the probability of having k-number of unsatisfied check nodes is calculated according to equation:

$$Prob(k) = \sum_{i=1}^{k+1}\left((k+1)\times(1-Prob_{USC}(i))\times\prod_{j\neq i}Prob_{USC}(j)\right).$$

* * * * *